US006567959B2

(12) United States Patent
Levin et al.

(10) Patent No.: US 6,567,959 B2
(45) Date of Patent: May 20, 2003

(54) METHOD AND DEVICE FOR VERIFICATION OF VLSI DESIGNS

(75) Inventors: Alexander Levin, Haifa (IL); Ziyad Hanna, Haifa (IL); Carl Seger, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 26 days.

(21) Appl. No.: 09/823,723

(22) Filed: Mar. 30, 2001

(65) Prior Publication Data

US 2002/0144218 A1 Oct. 3, 2002

(51) Int. Cl.$^7$ ............................................. G06F 17/50
(52) U.S. Cl. ........................ 716/5; 716/3; 716/7; 703/15
(58) Field of Search .................... 716/1–18; 703/14–16, 703/28

(56) References Cited

U.S. PATENT DOCUMENTS

| | | | | | |
|---|---|---|---|---|---|
| 5,202,889 A | * | 4/1993 | Aharon et al. | .............. | 714/739 |
| 5,331,568 A | * | 7/1994 | Pixley | ............................ | 716/3 |
| 5,544,067 A | * | 8/1996 | Rostoker et al. | .............. | 703/14 |
| 5,724,504 A | * | 3/1998 | Aharon et al. | .................. | 714/33 |
| 5,801,958 A | * | 9/1998 | Dangelo et al. | ............. | 716/18 |
| 6,006,028 A | * | 12/1999 | Aharon et al. | ................. | 703/21 |
| 6,035,107 A | * | 3/2000 | Kuehlmann et al. | ........... | 716/1 |
| 6,035,109 A | * | 3/2000 | Ashar et al. | .................... | 716/3 |
| 6,086,626 A | * | 7/2000 | Jain et al. | ....................... | 716/5 |
| 6,212,669 B1 | * | 4/2001 | Jain | .............................. | 716/7 |
| 6,269,467 B1 | * | 7/2001 | Chang et al. | .................. | 716/1 |
| 6,301,687 B1 | * | 10/2001 | Jain et al. | ...................... | 716/3 |
| 6,308,299 B1 | * | 10/2001 | Burch et al. | ................... | 716/4 |
| 6,378,112 B1 | * | 4/2002 | Martin et al. | .................. | 716/5 |
| 6,408,424 B1 | * | 6/2002 | Mukherjee et al. | ........... | 716/5 |
| 6,449,750 B1 | * | 9/2002 | Tsuchiya | ....................... | 716/4 |
| 6,470,482 B1 | * | 10/2002 | Rostoker et al. | ............... | 716/6 |
| 6,484,135 B1 | * | 11/2002 | Chin et al. | ..................... | 703/23 |
| 2001/0025369 A1 | * | 9/2001 | Chang et al. | .................. | 716/18 |
| 2002/0073380 A1 | * | 6/2002 | Cooke et al. | ................... | 716/1 |
| 2002/0108093 A1 | * | 8/2002 | Moondanos et al. | ........... | 716/4 |
| 2002/0144215 A1 | * | 10/2002 | Hoskote et al. | ................ | 716/3 |

OTHER PUBLICATIONS

Paruthi et al., "Equivalence checking combing a structural SAT–solver, BDDs, and simulation", Proceedings of 2000 International Conference on Computer Design, Sep. 17, 2000, pp. 459–464.*

Huang et al., "AQUILA: An Equivalence Verifier for Large Sequential Circuits", Proceedings of the ASP–DAC '97 Asia and South Pacific Design Automation Conference, Jan. 28, 1997, pp. 455–460.*

Rho et al., "Inductive verification of iterative systems", Proceedings of 29$^{th}$ ACM/IEEE Design Automation Conference, Jun. 8, 1992, pp. 628–633.*

Krohm et al., "The use of random simulation in formal verification", Proceedings of 1996 IEEE International Conference on Computer Design: VLSI in Computers and Processors, Oct. 7, 1996, pp. 371–376.*

* Fulvio Corno, Matteo Sonza Reorda, Giovanni Squillero, "Simulation–Based Sequential Equivalence Checking of RTL VHDL", Politecnico di Torino, Dipartimineto di Automatica e Informatica, Torino, Italy, the IEEE International Conference on Electronics, Circuits, and Systems, Sep. 5, 1999, vol. 1, pp. 351–354.

* cited by examiner

Primary Examiner—Matthew Smith
Assistant Examiner—Phallaka Kik
(74) Attorney, Agent, or Firm—Kenyon & Kenyon

(57) ABSTRACT

The present invention provides a formal equivalence verification method and system to determine the compatibility, or nonsimilarity, of two or more circuit designs. The method and system can check the corresponding verification nodes or candidates for cut points while accounting for input vectors including environmental conditions. The method and system may produce an answer for the user to indicate, for example, compatibility or disimilarity.

29 Claims, 2 Drawing Sheets

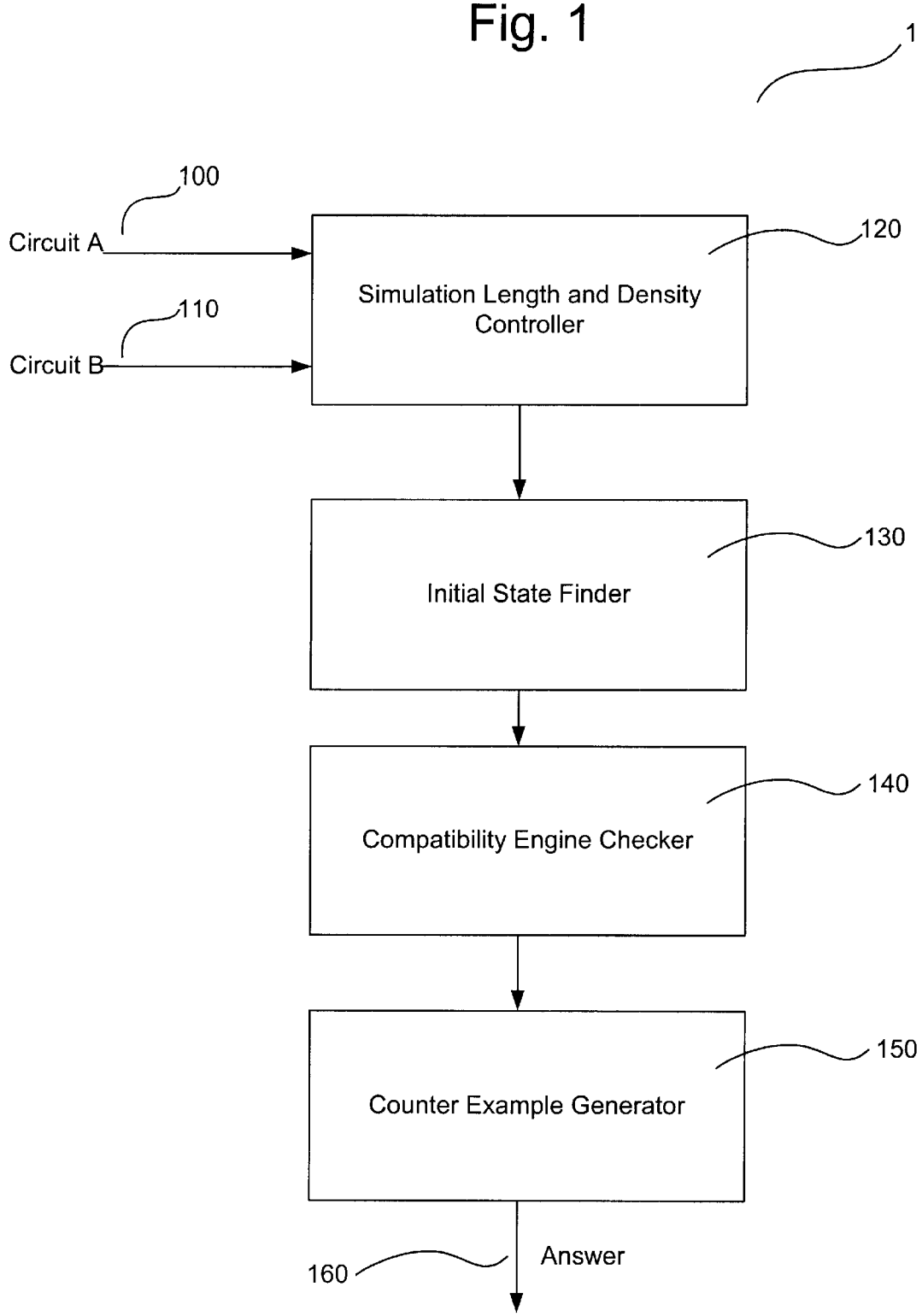

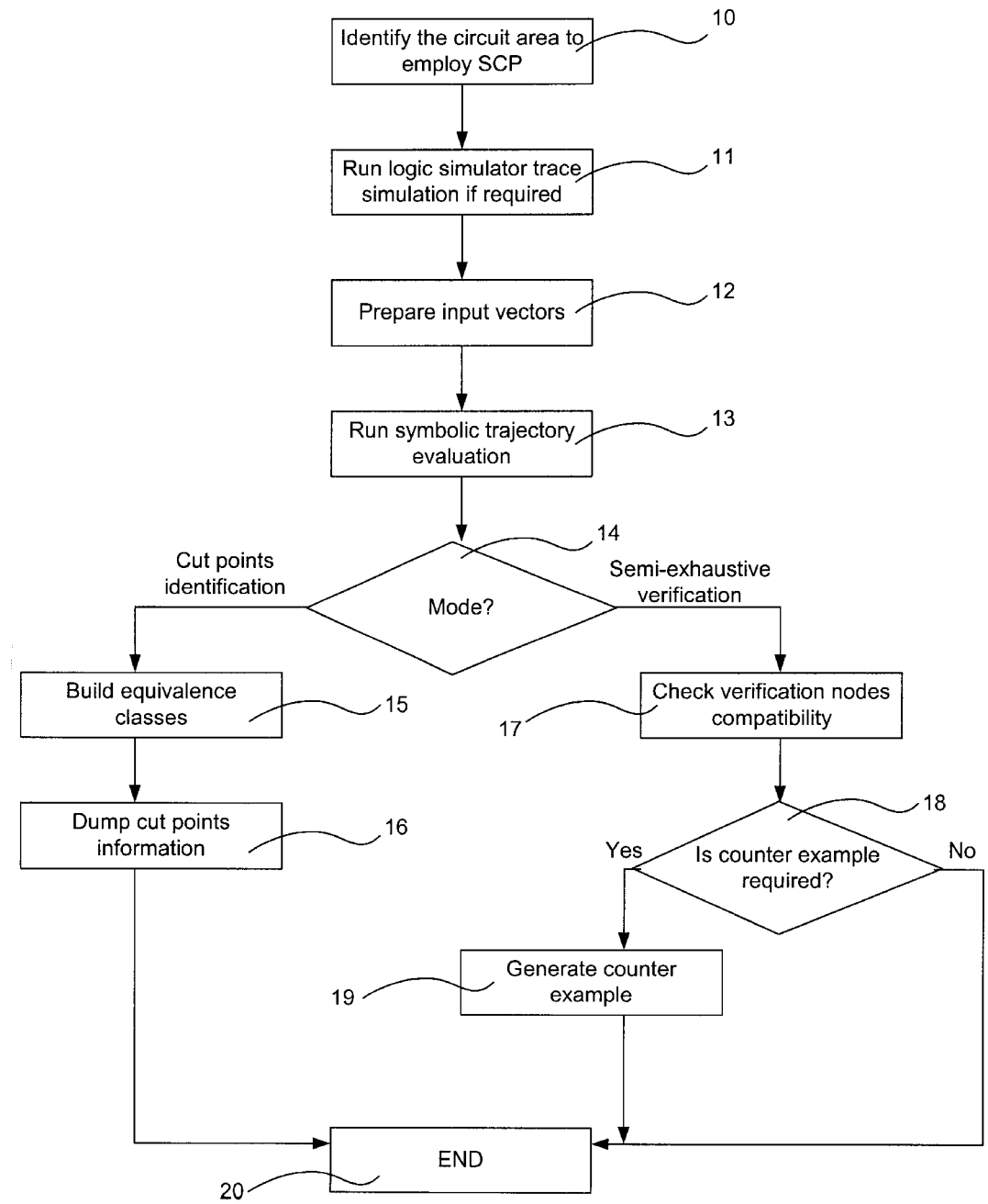

METHOD AND DEVICE FOR VERIFICATION OF VLSI DESIGNS

FIELD OF THE INVENTION

The present invention pertains to verifying circuit designs. More particularly, the present invention pertains to an improved system for verification of VLSI (Very Large Scale Integration) designs.

BACKGROUND OF THE INVENTION

Formal verification of the functioning of a digital design is a fundamental necessity with the increasing size and complexity as well as important functions to be executed by the digital design. Even more specifically, formal verification of a digital sequential system is needed, yet lacking, for those systems that are large and complex. The mathematical modeling techniques presently available for a digital sequential system, e.g., VHDL (Very High Speed Integrated Circuits (VHSIC) Hardware Description Language, e.g., standard VHDL-1076 (1987) as developed by Institute of Electrical and Electronic Engineers) and Verilog, are incapable of providing an efficient and confident verification review of some modem large and complex systems due in part to the complexity and memory requirements of the mathematical modeling technique.

A formal equivalence verification tool (FEV) is a CAD processing method used to ensure correct implementation of chip designs. Logic design size and complexity of chip designs are growing significantly in the field and present a challenge to the formal equivalence tool.

Formal equivalence verification, in the sequential domain particularly, is traditionally based on Binary Decision Diagrams (BDDs). Binary Decision Diagrams are graph structures that encode the state space or logic behavior and symbolic traversals of a Very Large Scale Integration (VLSI) logic design for all possible input value combinations. Unfortunately, because the huge state space of some modem Very Large Scale Integration (VLSI) designs, Binary Decision Diagrams cause memory complexity that cannot be confidently handled by the formal equivalence verification tool.

While most formal equivalence verification and state space traversal techniques remain infeasible for the required amount of memory of modem designs, common random binary simulation and Automatic Test Pattern Generator (ATPG) techniques also are not feasible because those techniques cover a relatively very small portion of the state space, thus providing poor or incorrect computed results. Further, some traditional techniques only perform a combinational equivalence check, thus not recognizing the equivalence of some sequentially equivalent circuits.

In "Simulation-Based Sequential Equivalence Checking of RTL VHDL", by Fulvio Corno et al. for Politecnico di Torino, published in 1999 by IEEE (hereinafter referred to as "Corno reference", the Corno reference's algorithm appears based on genetic algorithms for producing meaningful test patterns for simulation, and interacts with a VHDL simulator. One shortcoming of the Corno reference is that it cannot provide any equivalence proof and is instead oriented towards finding a difference. The Corno reference discusses its prototype RAVE (RT-level Automatic Verificator) which proved in test runs to have low run times on moderately large circuits. RAVE, the RT-level Automatic Verificator, uses a genetic algorithm and when presented with two circuits to be proven equivalent, RAVE searches in the space of all possible input sequences for a counterexample, the counterexample being a sequence that generates a different output response in the two circuits. The Corno reference's algorithms do not provide useful coverage for complex chip designs and instead the algorithms suffer from poor approximation due to low coverage of the space traversal.

In view of the above, there is a need for an efficient technique which can provide larger state space coverage and simultaneously produce high quality results.

BRIEF DESCRIPTION OF THE DRAWINGS

FIG. 1 shows a block diagram of an embodiment of the system according to an embodiment of the present invention.

FIG. 2 shows a flowchart showing the operation of the Sequential Cut Points (SCP) system and method according to an embodiment of the present invention.

DETAILED DESCRIPTION

The present invention provides a SCP (Sequential Cut Points) system and method that compares the logic behavior of two Very Large Scale Integration (VLSI) designs using random symbolic simulation technology. The logic behavior of the two design models is semi-exhaustively compared through the simulation runs. The Sequential Cut Points system and method of the present invention can find logic mismatches and computes equivalent states, e.g., sequential cut points, in the two observed design models. The sequential cut points are used to prune the state space and thus significantly reduce the size of the state space to make the formal equivalence verification tool task efficiently manageable. This pruning of the state space by the present invention can provide significant speedup for the overall sequential verification process in comparison with traditional state space traversal methods.

Random Symbolic Simulation is a simulation technique that enables logic simulation of a mixture of concrete logic values (1, 0, x), where "x" indicates "don't care", and Boolean variables. Simulation trace of a verification node (a signal to be verified) is a sequence of Boolean values (0, 1, x, Boolean function) computed through the random symbolic simulation. Two simulation traces are compatible if they satisfy the following rules: i) in each simulation step (except the last one) the values are either equal or x; and ii) in the last simulation step the values are equal. Two verification nodes are compatible if their simulation traces are compatible.

Referring to FIG. 1, the main components of the Sequential Cut Points (SCP) system and method according an embodiment of the present invention are shown. Two circuits, Circuit A 100 and Circuit B 110, are input into the SCP system and/or method 1 of the present invention. One component of the SCP system and/or method 1 is the simulation length and density controller 120 which controls the behavior and effectiveness of SCP technology through its simulation length and density parameters. The simulation length is defined by the number of clock cycles in the simulation. The density depends on the number of symbolic variables introduced in each phase of the simulation. Large length or density values can yield better cut-point identification.

Another component of the SCP system and/or method 1 according to the embodiment of the present invention as shown in FIG. 1 is the initial state finder 130. The initial state finder 130 finds a valid initial state at which a random symbolic simulation process can start. The initial state finder 130 also takes into account environmental conditions and other useful constraints or assumptions. This finding of the valid initial state can be meaningful to the correctness and the efficiency of the SCP technology of the present invention. According to various embodiments of the present invention, SCP technology can use various heuristics for states resetting, such as the combinational fixed-point algorithm (CFP), random binary initialization patterns and/or user given initialization patterns.

Another component of the Sequential Cut Points system and/or method (SCP) 1 according to the present invention as shown in FIG. 1 is the compatibility engine checker 140. An algorithm of the SCP system and/or method 1 according to the present invention can be based on running symbolic simulation on both specification and implementation models. That algorithm can be followed by node compatibility checking by the compatibility engine checker 140 of the verification nodes during each simulation step.

Another component of the SCP system and/or method 1 according to the present invention as shown in FIG. 1 is the counter example generator 150 which can effect an output answer 160. That is, when the verification nodes are determined to be not compatible by the compatibility engine checker 140, a counter example and/or simulation trace may be computed to demonstrate to the user the existence of logic mismatch between the two models by the counter example generator 150.

The Sequential Cut Points system or method (SCP) 1 trades off between the complete state traversal and binary simulation techniques by providing enough state traversal coverage without hitting the capacity limits while enabling high confidence results. SCP simulation length and density parameters control the state space coverage. In addition for coping with large and complex design cases, SCP can split the entire symbolic simulation process into slices so that a memory allocated in a current slice can be "freed" and available for use in the next one, so the memory consumption remains low. Finally, the SCP module can be combined with the existing simulation techniques such as a logic simulator for computing user traces.

FIG. 2 shows a flowchart 0 describing the operation of the Sequential Cut Points (SCP) algorithm(s) according to one embodiment of the present invention. In this embodiment, the system can be presented with two circuit design models and pairs of verification nodes and/or a list of candidates to be cut points. The SCP according to the present invention can check equivalence of the verification nodes if the system was run in semi-exhaustive mode. Otherwise, the SCP may generate a cut points file. In step 10 of FIG. 2, the user or an automatic or manually manipulated device can identify the area where to employ the SCP system and/or method. This step 10 can entail pruning the various models of the observed system and determining which nodes can participate in the SCP system; those nodes include nodes that are implied by the verification nodes or by the candidates to be cut points.

In the next step 11 of FIG. 2, it is determined whether a logic simulator trace file was specified by the system. If a logic simulator trace file was specified, then the Sequential Cut Points (SCP) system runs a logic simulator trace simulation and all verification nodes' simulation traces are filled. In the next step 12 of FIG. 2, the input vectors are prepared for random symbolic simulation. The data may involve the number of variables injected into each phase of the simulation and the simulation length. Practically, the number of variables and simulation length are determined by the user or a device which generates such data in accordance with working norms.

In the next step 13 of FIG. 2, Symbolic Trajectory Evaluation (STE) simulation is run and all verification nodes' simulation traces are filled. In the next step 14 of FIG. 2, the mode of operation is determined, that is whether the situation is cut points identification or semi-exhaustive verification. If the SCP module is determined to be cut point identification, then the next step 15 involves dividing all candidates to be cut points into equivalence classes by their simulation traces. In the following step 16, the cut points information is dumped into a file. The system can now be determined as finished in step 20.

In step 14 of FIG. 2, if the SCP module is determined to be semi-exhaustive verification, then the next step 17 involves checking the compatibility of the verification nodes by comparing the verification nodes' simulation traces and in the next step 18 producing an answer of whether they were similar or non-similar. In the following step 19, if the answer produced at step 18 was that the verification nodes' simulation traces were disimilar or "differ"then a counter example is generated. The counter example is a sequence that generates a different output response in the two observed designs. When the counter example is produced, then a user may use a debugger or Symbolic Trajectory Evaluation (STE) in order to visualize the counter example and/or observe the values at the nodes. At this point, the system can be determined as finished in step 20. If the answer produced at step 18 was that the verification nodes' simulation traces were similar, then no counter example is generated. At this point the system can be determined as finished in step 20.

The Sequential Cut Points technology (SCP) according to the present invention is useful in formal equivalence tools. Such formal equivalence tools are used to confidently check systems having complex logic designs. The SCP technology according to the present invention can be used within and outside of any formal equivalence tool providing service to quickly and efficiently determine logic mismatches between, e.g., abstract register transfer level (RTL) design and its implementation, such as a gate level model or schematics.

The SCP technology of the present invention provides a tool for formal equivalence verification problems, which can aid in avoiding costly design errors which can delay the production of processors. Further, all states of the SCP technology can be automatic so that there is no need for user interaction in the execution. The user may predetermine and input the path of signals into the present invention in order to check the semi-exhaustive mode or cut points. If the cut points mode is used, then the cut point candidates in the SCP technology can be executed by the pruning models of the system as discussed herein. The pruning models can be generated automatically by the SCP technology or inputted by the user to specify a particular focus. The pruning can be done structurally, e.g., running the output of the SCP execution through a modem.

An embodiment of the present invention was run on a model on a branch prediction unit or branch prediction unit functional block, e.g., BPU fub, on verification nodes having about 800 to 1000 variables, that is the number of inputs and latches in both models running together. In this example, the embodiment of the SCP method was run for a simulation length of 100 clock cycles and a log pattern of about 1. In further example of the model on a branch prediction unit functional block, when an embodiment of the SCP method was run on the verification nodes having about 200 to 300 variables, the user could increase the log pattern up to about 4. Another embodiment of the present invention was run on a model on a cache memory unit or cache memory unit functional block, e.g., RAFRAM fub, on verification nodes having about 200 to 400 variables. In this example, the embodiment of the SCP method was run for a simulation length of about 60 cycles and a log pattern varying between about 2 and 4. From the examples of the present invention, a trend of the relationship between the time and memory consumption with respect to the confidence can be observed.

Embodiments of the present invention can provide a method for formal equivalence verification to provide a first design circuit having a first verification node; to provide a second design circuit having a second verification node, the first and second verification nodes corresponding to each other; to prepare an at least one input vector for random symbolic simulation; to execute Symbolic Trajectory Evaluation (STE) simulation and filling any simulation traces of the first and second verification nodes; to determine if mode of operation is cut points identification or semi-exhaustive verification, when it is determined that the mode of operation is semi-exhaustive verification then comparing any simulation traces of the corresponding first and second verification nodes; and to produce an answer to the system to indicate whether the simulation traces of the corresponding first and second verification nodes were similar or non-similar; when it is determined that the mode of operation is cut points identification then dividing the first and second cut point candidates into equivalence classes by their simulation traces.

Although several embodiments are specifically illustrated and described herein, it will be appreciated that modifications and variations of the present invention are covered by the above teachings and within the purview of the appended claims without departing from the spirit and intended scope of the invention.

What is claimed is:

1. A method for formal equivalence verification comprising:
   providing a first design circuit having a first verification node;
   providing a second design circuit having a second verification node, the first and second verification nodes corresponding to each other;
   preparing an at least one input vector for random symbolic simulation;
   executing symbolic trajectory evaluation simulation and filling any simulation traces of the first and second verification nodes;
   determining if mode of operation is cut points identification or semi-exhaustive verification, and when it is determined that the mode of operation is semi-exhaustive verification, then comparing any simulation traces of the corresponding first and second verification nodes;
   producing an answer to indicate whether the simulation traces of the corresponding first and second verification nodes were similar or non-similar.

2. The method of claim 1, further comprising generating a counter example when the answer is determined as non-similar.

3. The method of claim 2, further comprising before preparing the at least one input vector for random symbolic simulation, executing a logic simulator trace simulation and filling the simulation traces of the corresponding first and second verification nodes when a logic simulator file is predetermined to run.

4. The method of claim 1, wherein the method is run in semi-exhaustive mode.

5. The method of claim 4, wherein the method is used in verifying Very Large Scale Integration circuits.

6. The method of claim 1, wherein the at least one input vector includes at least one of a simulation length and a number of the input vectors.

7. The method of claim 6, wherein the at least one of the simulation length and the number of input vectors are predetermined by a user.

8. The method of claim 1, wherein when the answer is similar, an alert signal is produced to indicate that the simulation traces of the corresponding first and second verification nodes were similar.

9. The method of claim 1, wherein the method is used to determine logic mismatches between the first and second design circuits in semi-exhaustive mode.

10. The method of claim 9, wherein the first design circuit is an abstract RTL design circuit and the second design circuit is an implemented RTL design circuit.

11. A method for formal equivalence verification comprising:
    providing a first design circuit having a first candidate cut point;
    providing a second design circuit having a second candidate cut point, the first and second candidate cut points corresponding to each other;
    preparing an at least one input vector for random symbolic simulation;
    executing symbolic trajectory evaluation simulation and filling all simulation traces of any verification nodes;
    determining if mode of operation is cut points identification or semi-exhaustive verification, and when it is determined that the mode of operation is cut points identification, then dividing the first and second cut point candidates into equivalence classes by their simulation traces.

12. The method of claim 11, further comprising before preparing the at least one input vector for random symbolic simulation, executing a logic simulator trace simulation and filling the simulation traces of the corresponding first and second verification nodes when a logic simulator file is predetermined to run.

13. The method of claim 11, further comprising dumping cut points information into a file.

14. The method of claim 13, wherein the method is used in verifying Very Large Scale Integration circuits.

15. The method of claim 14, further comprising:
    allocating identification of an area of the first and second design circuits to employ the method to at least one of a user, automatic manipulated device and a manually manipulated device.

16. The method of claim 11, wherein the at least one input vector includes at least one of a number of input vectors and a simulation length.

17. The method of claim 16, wherein the at least one of the number of input vectors and the simulation time length for the method are predetermined by a user.

18. The method of claim 11, further comprising:
    generating a signal to the user when the cut points are dumped into the file, the file being a digital file and being accessible by the user.

19. A formal equivalence verification simulation system of two design circuits comprising:

a simulation length and density controller to control simulation length and density parameters;

an initial state finder to provide for various input vectors;

a compatibility engine checker to check the two design circuits and to check compatibility of any verification nodes of the two design circuits during each simulation step;

a counter example generator to generate a counter example to when the compatibility engine checker determines that corresponding verification nodes of the two design circuits are not similar.

20. The system of claim 19, wherein the simulation length is a number of clock cycles in the simulation and the density parameters is a number of symbolic variables introduced in each phase of the simulation.

21. The system of claim 20, wherein the simulation length is about 20 to about 100 cycles and the density parameters is between about 1 to about 4 depending upon at least one of an amount of pipe stages and an amount of logic stages to yield better cut point identification.

22. The system of claim 19, wherein the various input vectors include at least one of a number of input vectors and a simulation length.

23. The system of claim 22, wherein the input vectors are at least one of predetermined by a user and by random symbolic simulation process which starts at an initial state.

24. The system of claim 19, wherein the initial state finder finds an initial state using at least one of a combinational fixed-point algorithm, a random binary initialization patterns, and a user given initialization pattern.

25. The system of claim 19, further comprising:

a process splitter to split the simulation system into at least two circuit area phases so that a memory allocated in a first of the at least two circuit area phases is capable of being made available for use in a second of the at least two circuit area phases.

26. A set of instructions residing in a storage medium, the set of instructions capable of being executed by a processor to implement a method for formal equivalence verification comprising:

providing a first design circuit having a first verification node;

providing a second design circuit having a second verification node, the first and second verification nodes corresponding to each other;

preparing an at least one input vector for random symbolic simulation;

executing symbolic trajectory evaluation simulation and filling any simulation traces of the first and second verification nodes;

determining if mode of operation is cut points identification or semi-exhaustive verification, and when it is determined that the mode of operation is semi-exhaustive verification, then comparing any simulation traces of the corresponding first and second verification nodes;

producing an answer to indicate whether the simulation traces of the corresponding first and second verification nodes were similar or non-similar.

27. The set of instructions residing in a storage medium of claim 26, further comprising:

generating a counter example when the answer is determined as non-similar;

before preparing the at least one input vector for random symbolic simulation, executing a logic simulator trace simulation and filling the simulation traces of the corresponding first and second verification nodes when a logic simulator file is predetermined to run; and wherein the at least one input vector includes at least one of a simulation length and a number of the input vectors.

28. A set of instructions residing in a storage medium, the set of instructions capable of being executed by a processor to implement a method for formal equivalence verification comprising:

providing a first design circuit having a first candidate cut point;

providing a second design circuit having a second candidate cut point, the first and second candidate cut points corresponding to each other;

preparing an at least one input vector for random symbolic simulation;

executing symbolic trajectory evaluation simulation and filling all simulation traces of any verification nodes;

determining if mode of operation is cut points identification or semi-exhaustive verification, and when it is determined that the mode of operation is cut points identification, then dividing the first and second cut point candidates into equivalence classes by their simulation traces.

29. The set of instructions residing in a storage medium of claim 28, further comprising:

before preparing the at least one input vector for random symbolic simulation, executing a logic simulator trace simulation and filling the simulation traces of corresponding first and second verification nodes when a logic simulator file is predetermined to run;

dumping cut points information into a file;

allocating identification of an area of the first and second design circuits to employ the method to at least one of a user, automatic manipulated device and a manually manipulated device;

generating a signal to the user when the cut points are dumped into the file, the file being a digital file and being accessible by the user.

* * * * *